United States Patent [19]
Kaul et al.

[11] Patent Number: 5,444,296
[45] Date of Patent: Aug. 22, 1995

[54] BALL GRID ARRAY PACKAGES FOR HIGH SPEED APPLICATIONS

[75] Inventors: Sunil Kaul, Fremont; Douglas A. Laird, Los Gatos, both of Calif.

[73] Assignee: Sun Microsystems, Inc., Mountain View, Calif.

[21] Appl. No.: 156,576

[22] Filed: Nov. 22, 1993

[51] Int. Cl.6 .............................................. H05K 7/00
[52] U.S. Cl. .................. 257/686; 257/720; 257/723; 257/724
[58] Field of Search ............... 257/686, 720, 723, 724; 361/396

[56] References Cited

U.S. PATENT DOCUMENTS 5,172,303  12/1992  Bernardoni et al. ............... 257/686
5,239,448  8/1993   Perkins et al. ..................... 257/686

FOREIGN PATENT DOCUMENTS 60-22348  2/1985  Japan .
44056     2/1989  Japan .
286353    11/1989 Japan .

Primary Examiner—Robert P. Limanek
Assistant Examiner—Roy Potter
Attorney, Agent, or Firm—Blakely Sokoloff Taylor & Zafman

[57] ABSTRACT

A package and packaging technique for enhancing performance of critical chips within an electronic device, wherein the critical chips comprise an integrated circuit. The package includes a main package incorporating a first integrated circuit coupled to a substrate board. At least one package having a second integrated circuit is mounted to the main package in order to reduce (i) propagation delay for data to transfer between critical chips within the main package and one of the plurality of packages or between the critical chips within the plurality of packages and (ii) total footprint area. The method for implementing such a package including the steps of packaging the first and second integrated circuits and electrically coupling these integrating circuits together in a mounted position.

14 Claims, 2 Drawing Sheets

BALL GRID ARRAY PACKAGES FOR HIGH SPEED APPLICATIONS

BACKGROUND OF THE INVENTION

1. Field of the Invention

The present invention relates to an apparatus and method for packaging critical chips used in high speed applications. More specifically, the present invention relates to an integrated circuit package and packaging technique which would minimize interconnection distances between at least two critical chips, such as, for example, a central processing unit "CPU") chip and an external cache memory chip, as well as reduce the total footprint area (i.e., the surface area used by the associated chip packages and corresponding connections) of the integrated circuit package implemented on the substrate board.

2. Background of the Field

Over the last decade, there have been many advances in integrated circuit technology which have had a dramatic impact on the computer industry. Each and every year, computer companies are providing faster and more sophisticated computer systems. These computer systems are, of course, designed and built with faster and more sophisticated critical chips. For the purpose of this application, critical chips are defined as chips that are necessary for the computer system to function properly, such as, for example, CPUs, memory chips, etc.

It is common knowledge that critical chips, especially CPU chips, are constantly being designed with a greater number of additional features and with the capability of supporting such additional features. Current generation CPU chips are now being implemented into integrated circuit packages having large lead counts in a range of a couple hundreds of output leads (i.e., pins). For example, one of Sun's Microsystems' microprocessor products has 288 pins with a pitch (i.e., the spacing distance between the pins) of approximately 0.25 millimeters. With the advent of more advanced critical chips, a greater lead count will be required.

One problem associated with increasing lead count is that the pitch between pins drastically decreases, provided the same total footprint area is desired. Finer pitch has a direct result in increasing manufacturing costs for two primary reasons. A first reason being that it is more likely that the leads will not be positioned properly by the assembly machines because there now exists a smaller degree of error in placement of the leads by the assembly machines. As a result, yield losses increase resulting in an increase in component costs. The second reason being that more precise assembly machinery may be required in order to satisfy the finer pitch requirements, thereby requiring a large increase in capital investment.

A second problem occurring in the next generation of critical chips is that as performance goes up, propagation time delays play a greater role in computer operations. It is known that there exists a propagation time delay for data to travel between a first and a second critical chip. As these critical chips are designed to operate at greater frequencies, the delay caused by the interconnection distances between such chips plays a paramount role in the overall speed of the computer system. Thus, there is a need for a package and packaging technique to reduce such time delays.

Another problem coming into view with respect to next generation critical chips is greater thermal dissipation will be required. Tape Automated Bonding ("TAB"), Quad Flat Package ("QFP") type packages are not easy packages to modify when the chip is dissipating over 20 watts. Therefore, the public is desirous of obtaining an alternate package that provides sufficient thermal dissipation without complex package modifications.

BRIEF SUMMARY OF THE INVENTION

The present invention describes an apparatus and method for packaging integrated circuits and more specifically, an integrated circuit package and packaging technique for a plurality of critical chip used primarily in connection with high speed applications. The integrated circuit package reduces the interconnection distances between a plurality of critical chips thereby reducing transmission delays between critical chips. This transmission delay plays an increasingly important part in the total time delay as processing speed increases. In addition, the integrated circuit package also reduces the total footprint area enabling more circuitry to be incorporated on a substrate board.

The apparatus comprises a main package which houses an integrated circuit. The main package is capable of supporting at least one other package mounted thereon. Due to the fact that at least one other package is mounted on the main package, the interconnection distance is greatly reduced thereby decreasing propagation time delay between critical chips which is one of the primary delays in high speed computers, as well as the total footprint area.

Furthermore, the method for implementing the present invention comprises five steps. First, the first integrated circuit is packaged within a main package having a predetermined area. The package is sealed, generally hermetically although not required, to prevent damage to the first integrated circuit. Secondly, the second integrated circuit is packaged within a second package having an arbitrary dimension, but preferably, having a width and length less than or equal to a width and length of the main package. Next, the second package is mounted onto the main package. The next step is where the second integrated circuit within the second package is electronically coupled to the first integrated circuit. An optional step is that the first package in combination with the second package are electronically coupled to the substrate board to be operable within a computer system.

BRIEF DESCRIPTION OF THE DRAWINGS

The objects, features and advantages of the present invention will become apparent from the following detailed description of the present invention in which.

DETAILED DESCRIPTION OF THE INVENTION

An apparatus and method is described for housing integrated circuits of semiconductor critical chips, preferably used in connection with high-speed applications, in order to reduce the propagation delay of data being electrically transmitted between critical chips as well as the total footprint. It should be noted that well-known coupling processes, packages and the like are not set forth in order to avoid unnecessary obscuring of the present invention.

In the following detailed description, numerous specific details are set forth, such as a specific design configuration. It is apparent, however, to one skilled in the art that the present invention may be practiced without incorporating the specific configuration. Furthermore, it should be borne in mind that the present invention need not be limited for use in a computer system, but may find wide application for use in any electrical device internally controlled by critical chips.

Figure 1:
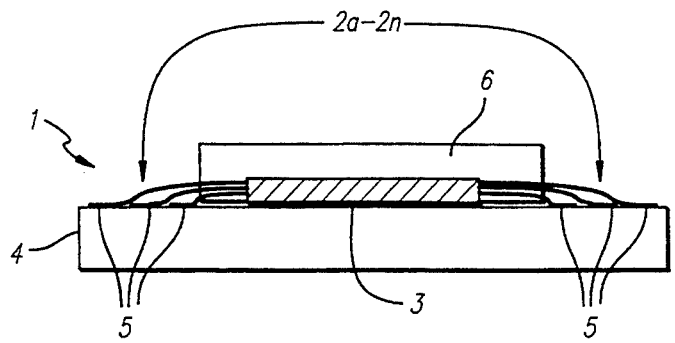
FIG. 1 is a cross-sectional view of a conventional TAB packaging technique.

Currently, there exist many integrated circuit packages and packaging techniques in the marketplace. In the packaging of integrated circuits, a die which comprises the integrated circuits is placed within a package and mounted onto a substrate board. Typically, a plurality of leads are utilized to provide the electrical coupling to the die. One such package is a Tape Automated Bonding ("TAB") package as shown in FIG. 1.

The TAB package 1 for a critical chip comprises a die 3 which has integrated circuits for performing predetermined operations such as, for example, execution of instructions (CPU chip), memory storage (cache or other memory chips) and the like. The die 3 is completely encapsulated within a package 1 by using conventional encapsulating techniques. The package 1 is made of plastic and/or ceramic because it protects the die 3 from mechanical damage as well as from reliability problems caused from moisture, corrosion and the like. A plurality of leads 2a–2n are then formed to extend beyond the package in order to provide an electrical coupling between the die 3 and a substrate board 4 and to secure the package 1 thereto. The substrate board 4 is normally a peripheral card or a motherboard coupled to the backplane of a computer system in order to provide electrical coupling of the die 3 so as to operate within the computer system. The plurality of leads 2a–2n are attached to the substrate board 4 through solder 5.

As briefly discussed above, the current progression of technology indicates that critical chips in a next generation are likely to have additional features not supported by conventional critical chips and thus, will likely require a greater lead count than these conventional critical chips. As a result, TAB technology is susceptible to reduced (i.e., finer) pitch requirements between the packaging leads, unless the die size is increased proportionately which, undesirably, increases the total footprint. Increasing the die size to prevent reduction of pitch, however, would also increase manufacturing costs associated therewith; namely, finer pitch places a greater burden on assembly machinery connecting the die 3 which would cause a lower yield of functional critical chips, thereby increasing the overall manufacturing costs associated therewith. Although more precise assembly machinery could increase the yield, large capital investments for more advanced assembly machinery would be required.

Furthermore, TAB technology does not offer any avenues to mitigate time delay caused by the interconnection distances between critical chips. Limiting this time delay is a major problem facing next generation critical chips which are be solved by the present invention.

Figure 2:
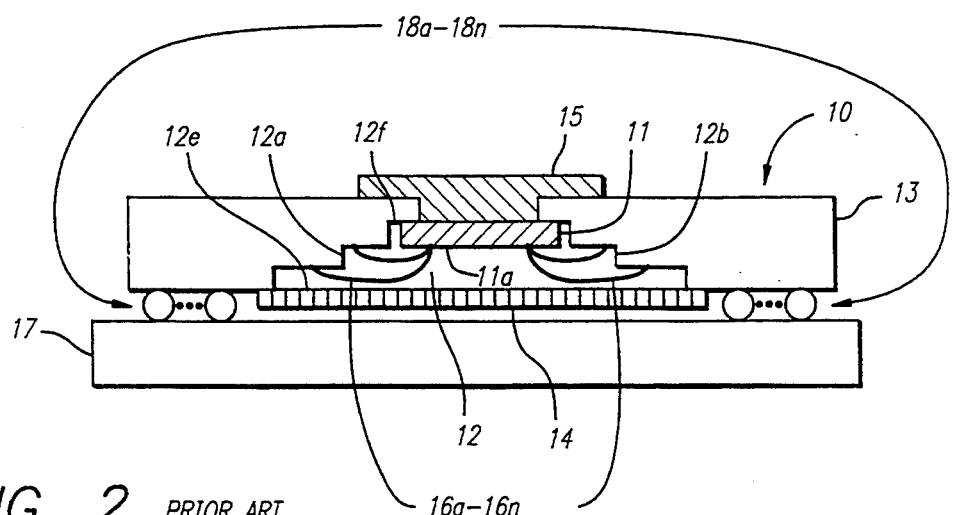
FIG. 2 is a cross-sectional view of a conventional BGA packaging technique.

Based on the above-identified problems, computer companies have turned to a second technology for integrated circuit packaging; more particularly, a conventional Ball Grid Array ("BGA") packages as illustrated in FIG. 2. The critical chip 10 using the conventional BGA package comprises a die chip 11 sealed, preferably hermetically, within a cavity 12 of a BGA package 13. The BGA package 13 is made of high temperature resistant material such as a laminate or even ceramic. The die 11 is positioned within the cavity 12 of the BGA package 13 so that it is bordered along its side by a plurality of sidewalls 12a–12d of the BGA package 13. The die 11 is further bordered along its top and bottom portion of the cavity 12 by a lid 14 and a heat slug 15, respectively. The heat slug 15 is made of thermo-conductive material such as copper and can be easily altered to support needs for greater power dissipation.

An active side 11a of the die 11 is coupled to circuitry within the BGA package 13 through a plurality of wire leads 16a–16n or through flip chip technology (not shown). The circuity, in combination with the plurality of lead wires, provides a connection between the die 11 and the BGA package 13. When implementing flip chip technology, die 11 is inverted so that the active side 11a is facing the heat slug 15, and in lieu of wire leads 16a–16n, a plurality of solder balls would be placed on the active side 11a of the die 11 to be reflowed to the BGA package 13. The BGA package 13, which is generally lesser in total footprint area than conventional TAB and QFP packages, is coupled to a substrate board 17 via a plurality of solder balls 18a–18n. The substrate board 17 includes a plurality of conductive lines, such as address and data lines, disposed throughout the board 17 upon which such lines are activated when the board 17 is coupled to the computer backplane or any other connectors within the computer system.

Although the conventional BGA package indirectly mitigates the increasing pitch problem associated with conventional TAB packages by giving a system designer the freedom to use a greater package size to reduce the pitch, it does not solve the increased propagation time delays which presents a significant problem in high speed applications. Hence, it would be desirable to create a package and develop a packaging technique which minimizes propagation time delay as well as increases pitch margins. The present invention, in fact, minimizes propagation time delay by providing a main package which allows other packages to be mounted thereon in close proximity to the main package.

Figure 3:
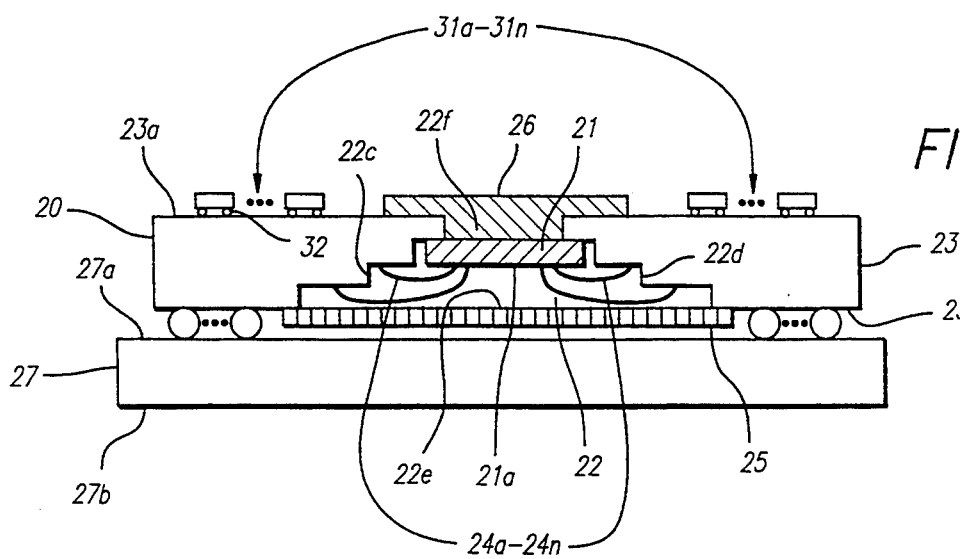
FIG. 3 is a cross-sectional view of one embodiment of the present invention.

Referring to FIG. 3, one embodiment of the present invention incorporating BGA packages is illustrated. It is contemplated, however, that the present invention need not be directed toward BGA packages solely, but can be designed to support any conventional packaging technique, such as, TABs, land grid arrays ("LGA") and the like.

The present invention illustrated in FIG. 3 is a package 20 for a critical chip, wherein the package 20 supports a plurality of critical chips. The package 20 comprises a die 21 sealed, preferably hermetically although not a necessity, within a cavity 22 of a main BGA package 23 by a package lid 25, a heat slug 26 and a plurality of sidewalls 22a–22d of the main BGA package 23 forming the cavity 22. Although the cavity 22 illustrated in this embodiment is a "cavity-down" design (i.e., an active side 21a of the die 21 is "active-down"), the cavity 22 could have easily been designed in a "cavity-up" orientation. The die 21 is secured within the main BGA package 23 by a plurality of wire bonds 24a–24n or by flip chip technology as previously discussed. The package lid 25 made of any hardened material such as plastic or ceramic, is placed along the opening 22e of the cavity 22 to protect the die 21 from contaminants and other external elements that could damage the die 21. The heat slug 26 is positioned along a second opening 22f of the cavity 22 to allow heat dissipation from the die 21 when it is in operation. The heat slug 26 is made of any thermo-conductive material such as copper.

The main BGA package 23 is made of any high temperature resistant material, such as, for example, Bisalmide Triazene and of sufficient size and area to enable the main package 23 to support a plurality of additional BGA packages 31a–31n. As seen in recent electrical simulations, the need for high speed data transfer between the CPU chip and a secondary chip is essential. The exchange rate of data becomes a bottleneck thereby reducing the speed at which the CPU chip set can operate.

Similar to conventional BGA packaging as illustrated in FIG. 2, the main BGA package 23 is mounted to a substrate board 27 having a top side 27a and a bottom side 27b as shown in FIG. 3. The substrate board 27 is responsible for taking signals from the main package 23 and providing communication with the rest of the system. Such mounting is accomplished through a plurality solder balls 28a–28n interposed between a bottom side 23b of the main BGA package 23 and the top side 27a of the substrate board 27 to electrically couple and securely fasten the main BGA package 23 to the substrate board 27. The plurality of solder balls 28a–28n provide very low inductance paths, an essential ingredient for high speed signals.

However, contrary to conventional BGA packages, a plurality of critical chips within additional BGA packages 31a–31n, which is not "to scale", are mounted on a top side 23a of the main BGA package 23 through any conventional coupling technique such as wire bonding and particularly solder balls 32. By mounting the additional BGA packages 31a–31n on the main BGA package 23, which houses the CPU integrated circuit, the total footprint area is reduced. As a result, the substrate board 27 is then able to fit more components thereon, which allows the system designer better signal integrity. Alternatively, the system designer may opt to incorporate larger BGA packages to reduce pitch, and still maintain the same total footprint area.

With respect to coupling of the critical chips through coupling of the additional BGA packages 31a–31n to the main BGA package 23 via solder balls 32, the combination of the BGA packages is reflowed in order to establish an electrical and mechanical connection between the two packages. Reflow is simply a melting and cooling of the solder balls 32 to establish a mechanical, and especially an electrical connection between two devices. When these joined packages are coupled to the substrate board 27 via solder balls, the combination of the substrate board 27 and the BGA packages 23 and 31a–31n are reflowed to establish another electrical and mechanical connection therebetween. Lateral shifting of the additional BGA packages 31a–31n from the main BGA package 23 could be prevented mechanically or varying the temperature profile of the soldering connections. It is also contemplated that the coupling could be accomplished in one reflow procedure.

Figure 4:
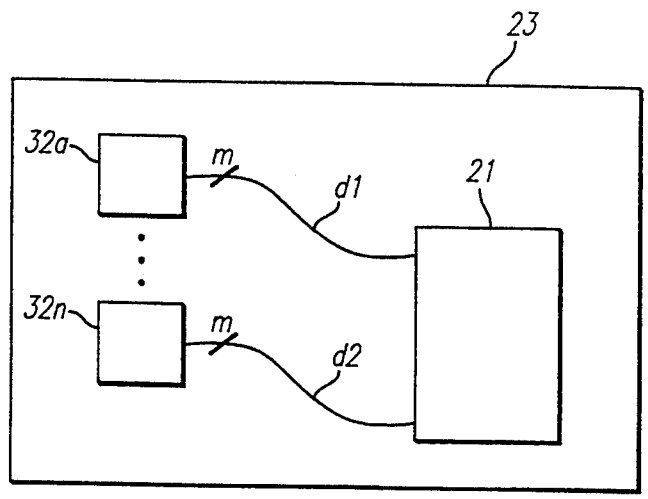
FIG. 4 is an overhead plan view of the embodiment illustrated in FIG. 3.

FIG. 4 shows an overhead plan view of the present invention illustrated in FIG. 3 with the plurality of integrated circuits 32a–32n housed within the corresponding additional BGA packages 31a–31n being integrally mounted on the main BGA package 23. Multiple signal lines "m" where $m \geq 2$) are routed between the plurality of integrated circuits 32a–32n and the integrated circuit 21 within the main BGA package 23. The interconnection distance between a first critical chip 31a and the critical chip contained by the main BGA package 23 is "d1" which is a distance in a range of 2–3 millimeters. The interconnection distance d1 is significantly less than a distance between a pair of critical chips which are packaged within conventional BGA packages "dconv"), which is approximately 6–8 millimeters. Moreover, another critical chip within the BGA package 32n is mounted on the main BGA package 23 such that an interconnection distance between these packages is approximately equal to "d2", which is also significantly less than "dconv". As a result, the propagation time delay for information being transfered between one of the integrated circuits within a corresponding BGA package 31a–31n and the integrated circuit 21 within the main BGA package 23 is greatly reduced.

Figure 5:
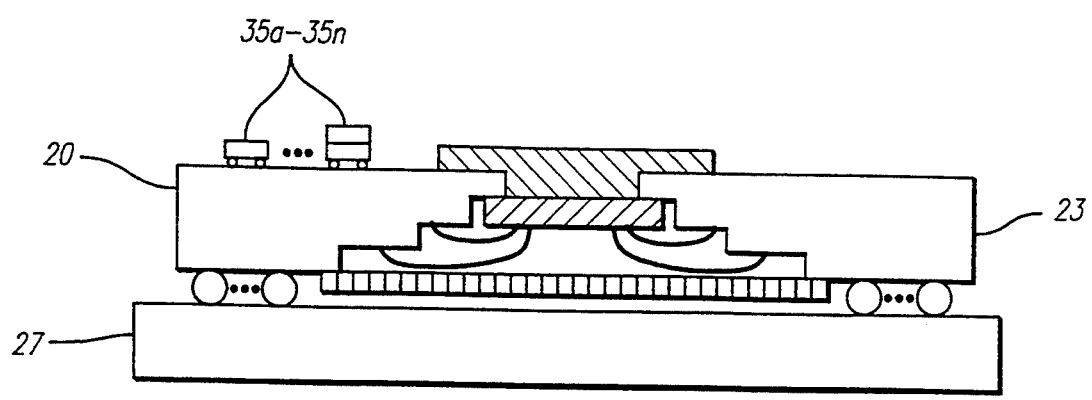
FIG. 5 is a cross-sectional view of a second embodiment of the present invention.

Another embodiment of the present invention is illustrated in FIG. 5, wherein the mountable BGA packages 35a–35n include at least one three-dimensional "stack-up" BGA package 35n coupled to the main BGA package 23 via solder balls, wire bonding or similar electrical coupling techniques to provide requisite electrical connections between the integrated circuits within such packages. As a result, the advantages realized by utilizing stack-up BGA packages in the present invention are three-fold. First, the area on the substrate board 27 occupied by the mountable BGA packages 35a–35n and associated interconnections is minimized since stack-up BGA packages only require minimal footprint area on the substrate board 27. This reduces the requisite size of the substrate board 27 which would enable smaller computers, such as portable and lap top computers, to support higher speed applications. A second advantage is that stack-up packages enable greater functionality (i.e., memory, speed, etc.) because more chips can be implemented than BGA packages externally mounted. Finally, mounting stack-up BGA packages directly upon the main BGA package increases yield because the assembly can be done in one single step rather than multiple steps required in order to interconnect each additional BGA package onto the main BGA package after assembly of the main BGA package.

The following is a detailed description of the method for packaging a first integrated circuit in order to decrease the time propagation delay of data being transferred between the first and a second integrated circuit. The method comprises five steps. First, in step 100, the first integrated circuit is packaged within a first package having a predetermined size and area. The package is sealed, preferably hermetically, to prevent damage to the first integrated circuit. In step 101, the second integrated circuit is packaged within a second package. The second package has a width and length quite smaller than the predetermined area. Such packaging may include coupling additional packages if the second package is equivalent to a stack package. In step 102, the second package is mounted onto the first package. Next, in step 103, the second integrated circuit the second package is electronically coupled to the first integrated circuit via solder balls or another conventional coupling technique. If the first and second packages are BGA packages, such coupling is done through conventional reflow procedures. Finally, in step 104, which is an optional step, the first integrated circuit in combination with the second integrated circuit are electronically coupled to the substrate board to be operable within the computer system.

The present invention described herein may be designed in many different methods and using many different configurations. While the present invention has been described in terms of various embodiments, other embodiments may come to mind to those skilled in the art without departing from the spirit and scope of the present invention. The invention should, therefore, be measured in terms of the claims which follow.

What is claimed is:

1. An apparatus for reducing propagation delay resulting from information being transferred between a first integrated circuit and a second integrated circuit by placing the second integrated circuit in closer proximity to the first integrated circuit, said apparatus comprising:
   a main integrated circuit package encapsulating the first integrated circuit, said main integrated circuit package having a top surface with a predetermined area;
   a second integrated circuit package encapsulating the second integrated circuit, the second integrated circuit package having a bottom surface with an area less than the predetermined area, being mounted on the main integrated circuit package; and
   a plurality of electrical connections between the main integrated circuit package and the second integrated circuit package in order to enable information to be transferred between the first integrated circuit and the second integrated circuit, said plurality of electrical connections include a plurality of solder balls coupled to a corresponding plurality 0f conductive signal lines, wherein at least one conductive signal line has a length less than four millimeters.

2. The apparatus according to claim 1, wherein the top surface of the main integrated circuit package has a length and a width sufficient in dimension to support the second integrated circuit package.

3. The apparatus according to claim 2, wherein the bottom surface of the second integrated circuit package has a length less than the length of the top surface of the first integrated circuit package.

4. The apparatus according to claim 3, wherein the bottom surface of the second integrated circuit package has a width less than the width of the top surface of the first integrated circuit package.

5. The apparatus according to claim 2, wherein the main integrated circuit package comprises a package lid and a heat slug.

6. The apparatus according to claim 5, wherein the first integrated circuit is positioned within a cavity and is sealed by the package lid, the heat slug and a plurality of sidewalls of the main integrated circuit package.

7. The apparatus according to claim 1, wherein the plurality of solder balls provide an electrical and mechanical coupling between the main and second integrated circuit packages.

8. The apparatus according to claim 1, wherein the main integrated circuit package includes a plurality of solder balls coupling the main integrated circuit package to a substrate board to enable the first and second integrated circuits to operate within a computer system.

9. The apparatus according to claim 8, wherein the substrate board includes a plurality of laminated boards layered together, the plurality of boards having a plurality of electrical signal lines interposed therebetween, the plurality of electrical signal lines coupling the first and second integrated circuits to a backplane of the computer system.

10. An apparatus for reducing propagation delay resulting from information being transferred between a first integrated circuit and a plurality of integrated circuits, the apparatus comprising:
    a main integrated circuit ball gate array package having a predetermined surface area on a top surface of the main integrated circuit ball gate array package in order to support a plurality of mountable integrated circuit packages corresponding to the plurality of integrated circuits, the main integrated circuit ball gate array package encapsulating the first integrated circuit within a cavity;
    the plurality of mountable integrated circuit packages each encapsulating one of the plurality of integrated circuits, wherein each of the mountable integrated circuit packages, having an area less than the predetermined area, is disposed upon the top surface of the main integrated circuit ball gate array package; and
    a plurality of electrical conductive signal lines to electrically couple the first integrated circuit within the main package to at least one of the plurality of integrated circuits within the plurality of mountable integrated circuit packages, wherein each of the plurality of electrical conductive signal lines has a length less than four millimeters.

11. The apparatus according to claim 10, wherein the main integrated circuit ball gate array package has a length equal to a first predetermined distance and a width equal to a second predetermined distance, while each of the plurality of mountable integrated circuit packages has a length less than the first predetermined distance and a width less than the second predetermined distance.

12. The apparatus according to claim 11, wherein the main integrated circuit ball gate array package is coupled to a substrate board via a plurality of solder balls.

13. The apparatus according to claim 12, wherein the substrate board provides an electrical connection between the first and second integrated circuits and a backplane of a computer system.

14. An apparatus for reducing propagation delay resulting from information being transferred between a first integrated circuit and at least one of a plurality of integrated circuits, the apparatus comprising:
    a main integrated circuit package having a heat slug mounted on a top surface of the main integrated circuit package, said top surface having a predetermined surface area in order to support a plurality of mountable integrated circuit packages corresponding to the plurality of integrated circuits, the main integrated circuit package encapsulating the first integrated circuit within a cavity;

the plurality of mountable integrated circuit package each encapsulating one of the plurality of integrated circuits, wherein each of the mountable integrated circuit packages, having an area less than the predetermined area, is disposed upon the top surface of the main integrated circuit package; and a plurality of electrical conductive signal lines to electrically couple the first integrated circuit within the main integrated circuit package to at least one of the plurality of integrated circuits within the plurality of mountable integrated circuit packages.

* * * * *